(12) United States Patent
Hempenius et al.

(10) Patent No.: US 7,884,919 B2
(45) Date of Patent: Feb. 8, 2011

(54) LITHOGRAPHIC APPARATUS AND DEVICE MANUFACTURING METHOD

(75) Inventors: Peter Hempenius, Luyksgestel (NL); Marcel Koenraad Marie Baggen, Nuenen (NL); Dirk-Jan Bijvoet, Eindhoven (NL); Sjoerd Nicolaas Lambertus Donders, Vught (NL); Youssef Karel Maria De Vos, Lille (BE)

(73) Assignee: ASML Netherlands B.V., Veldhoven (NL)

( * ) Notice: Subject to any disclaimer, the term of this patent is extended or adjusted under 35 U.S.C. 154(b) by 1065 days.

(21) Appl. No.: 11/350,278

(22) Filed: Feb. 9, 2006

(65) Prior Publication Data

US 2007/0182947 A1 Aug. 9, 2007

(51) Int. Cl.
*G03B 27/42* (2006.01)
(52) U.S. Cl. .............................. 355/53; 355/72; 355/76
(58) Field of Classification Search ................... 355/53, 355/72, 76
See application file for complete search history.

(56) References Cited

U.S. PATENT DOCUMENTS

2003/0040193 A1* 2/2003 Bailey et al. ................. 438/710
2003/0197841 A1* 10/2003 Araki et al. ................... 355/50

* cited by examiner

*Primary Examiner*—Edward J Glick
*Assistant Examiner*—Mesfin T Asfaw
(74) *Attorney, Agent, or Firm*—Sterne, Kessler, Goldstein & Fox P.L.L.C.

(57) ABSTRACT

A device manufacturing method includes transferring a pattern from a patterning device onto a substrate. The method includes bringing the patterning device and the support together, and applying a substantially stationary force between the patterning device and the support to hold the patterning device. The patterning device is now excited by a substantially dynamic force to enable a micro slipping thereof. Then, the patterning device is aligned, and the pattern is transferred from the patterning device onto the substrate. The patterning device may be excited with an alternating acceleration. When the patterning device is excited, the patterning device is allowed to settle with respect to the support, thereby improving a friction therebetween to reduce a risk of slipping or local slipping of the patterning device.

39 Claims, 4 Drawing Sheets

Fig. 4 a - c
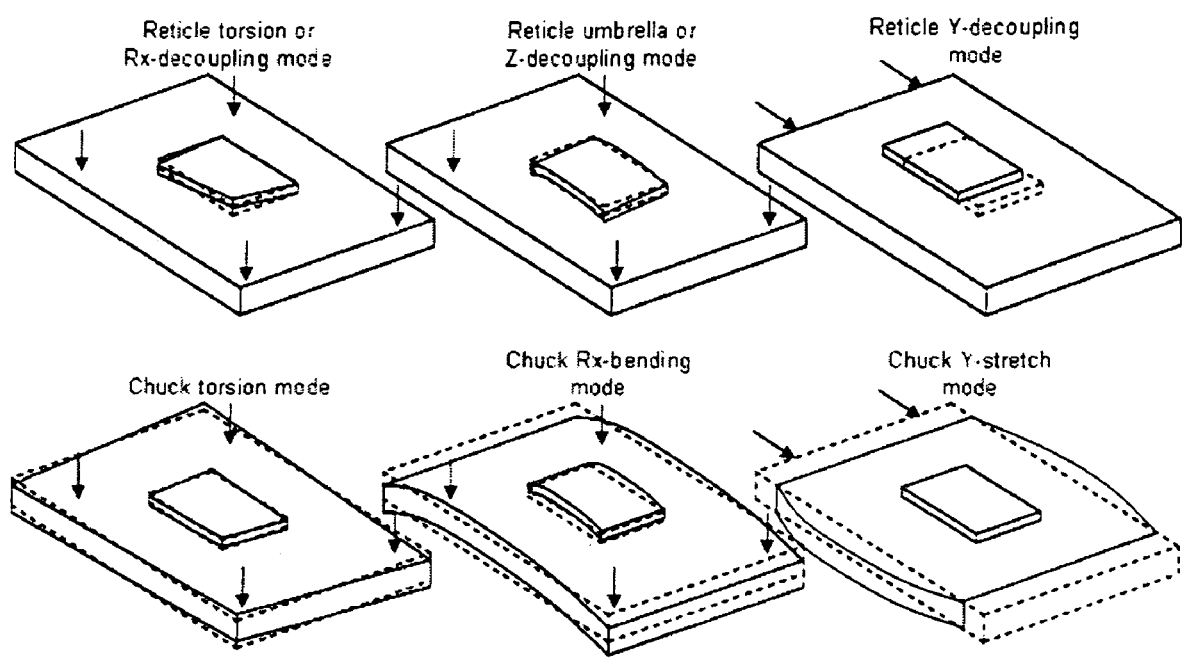
Fig. 4 d - f
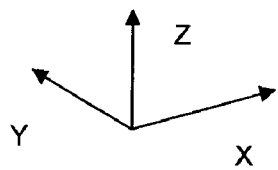

LITHOGRAPHIC APPARATUS AND DEVICE MANUFACTURING METHOD

BACKGROUND

1. Field

The present invention relates to a lithographic apparatus including a support constructed to hold a patterning device, to a lithographic apparatus including a substrate table constructed to hold a substrate, to such a support, to a device manufacturing method including transferring a pattern from a patterning device onto a substrate, and to a method to attach a patterning device to a support constructed to hold the patterning device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the patterning device may be held by a support. Commonly, the support will be provided with a drive device (such as linear motors) to move the support, thereby moving the patterning device held by the support. In this way, a simple exchangeability of the patterning device may be provided. Thus, in order to transfer another pattern onto the substrate, the patterning device may be exchanged with another patterning device. Commonly, an attachment mechanism is provided to be able to attach the patterning device to the support. Such attachment mechanism may include a mechanical clamp, an underpressure or vacuum suction device, an electrostatic clamp, or any other suitable constructions. Thereby, a force (in general a substantially stationary force) is applied between the patterning device and the support to be able to hold the patterning device.

In order to obtain a higher production volume and to improve the performance of the lithographic apparatus, it is desirable to increase the processing speed of the lithographic apparatus. On the other hand, the performance of a lithographic process is improved by increasing the resolution of the imaged pattern. In order to be able to increase the processing speed, the patterning device and, consequently, the support are subjected to higher accelerations. In that way, the patterning device can be positioned and moved at a higher speed. As a consequence, however, the patterning device is subjected to higher forces because of the larger accelerations. On the other hand, a higher complexity of chip structures or other semiconductor structures generally result in a larger size of the patterning device. However, the resolution and accuracy of the projection of the pattern may be more difficult to achieve with the use of larger patterning devices. The increase in the size of the patterning device has a twofold consequence on the forces to which it is subjected. At first, the increasing mass thereof will (given a certain acceleration of the patterning device) increase a force thereon. Moreover, such a larger size of the patterning device will also result in larger displacements thereof, thus as a consequence further increasing accelerations of the patterning device, thus further increasing forces thereon.

As explained above, the lithographic apparatus commonly uses a clamping mechanism or other holding mechanism to hold the patterning device by the support. As explained above, an increase of speed of the patterning support will result in an increase of forces on the patterning device. Commonly, the patterning device and, thus, the support, are subjected to accelerations along one of more axes which substantially coincide with a surface of the patterning device, thereby making e.g. scanning, stepping or other movements. As a consequence, the patterning device is subjected to forces parallel to the surface of the patterning device (e.g. due to inertia of the patterning device) which may translate into a tendency of the patterning device to slip with respect to the support, thereby limiting an achievable acceleration and a maximum size and weight of the patterning device, thus limiting a performance of the lithographic apparatus in order to avoid such slippage.

It is noted that slippage of the patterning device is undesired, as a displacement of the patterning device with respect to the support would adversely affect an accuracy of a positioning of the pattern on the substrate, thereby deteriorating a performance of the lithographic apparatus. Further, it is noted that in this document the terms slip, slipping and slippage may be used, however, these terms are to be understood as referring to a same phenomenon.

SUMMARY

It is desirable to reduce a slippage of a patterning device (or other device, such as a substrate) held by a support (or other supporting device, such as a substrate table) of, for example, a lithographic apparatus. It is also desirable to detect a slippage of the patterning device.

According to an embodiment of the invention, there is provided a device manufacturing method including transferring a pattern from a patterning device onto a substrate, the patterning device being held by a support, the method including a) bringing the patterning device and the support together, b) applying a substantially stationary force between the patterning device and the support to hold the patterning device, c) exciting the patterning device by a substantially dynamic force to enable a micro-slipping of the patterning device, d) aligning the patterning device and e) transferring the pattern from the patterning device onto the substrate.

In another embodiment of the invention, there is provided a method to attach a patterning device to a support constructed to hold the patterning device, the method including bringing the patterning device and the support together, applying a substantially stationary force between the patterning device and the support to hold the patterning device, exciting the patterning device by a substantially dynamic force to enable a micro-slipping of the patterning device; and aligning the patterning device.

According to a further embodiment of the invention, there is provided a lithographic apparatus including a support constructed to hold a patterning device, the lithographic apparatus including an actuator to excite the patterning device, and a control unit to control the actuator, wherein the control unit is arranged to drive the actuator to excite the patterning device by a substantially dynamic force to enable a micro-slipping of the patterning device, prior to aligning the patterning device.

According to a still further embodiment of the invention, there is provided a support constructed to hold a patterning device, the lithographic apparatus including an actuator to excite the patterning device, and a control unit to control the actuator, wherein the control unit is arranged to drive the actuator to excite the patterning device by a substantially dynamic force to enable a micro-slipping of the patterning device, prior to aligning the patterning device.

According to an again still further embodiment of the invention, there is provided a device manufacturing method including transferring a pattern from a patterning device onto a substrate, the method including a) bringing the patterning device and the support together, b) applying a substantially stationary force between the patterning device and the support to hold the patterning device, c) testing a holding of the patterning device by the support, d) aligning the patterning device; and e) transferring the pattern from the patterning device onto the substrate, wherein c) comprises c1) measuring a position of the patterning device with respect to the support, c2) applying to the patterning device a substantially planar force, and c3) gradually increasing the planar force until a displacement of the patterning device with respect to the support is measured.

According to again a further embodiment of the invention, there is provided a device manufacturing method including transferring a pattern from a patterning device onto a substrate, the substrate being held by a substrate table, the method comprising a) bringing the substrate and the substrate table together, b) applying a substantially stationary force between the substrate and the substrate table to hold the substrate, c) exciting the substrate by a substantially dynamic force to enable a micro-slipping of the substrate, d) aligning the substrate and e) transferring the pattern from the patterning device onto the substrate.

According to again a still further embodiment of the invention, there is provided a lithographic apparatus including a substrate table constructed to hold a substrate, the lithographic apparatus comprising an actuator to excite the substrate, and a control unit to control the actuator, wherein the control unit is arranged to drive the actuator to excite the substrate by a substantially dynamic force to enable a micro-slipping of the substrate, prior to aligning the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4a-4f depicts resonance modes of an assembly of the patterning device and the support according to an embodiment of the invention;

DETAILED DESCRIPTION

Figure 1:
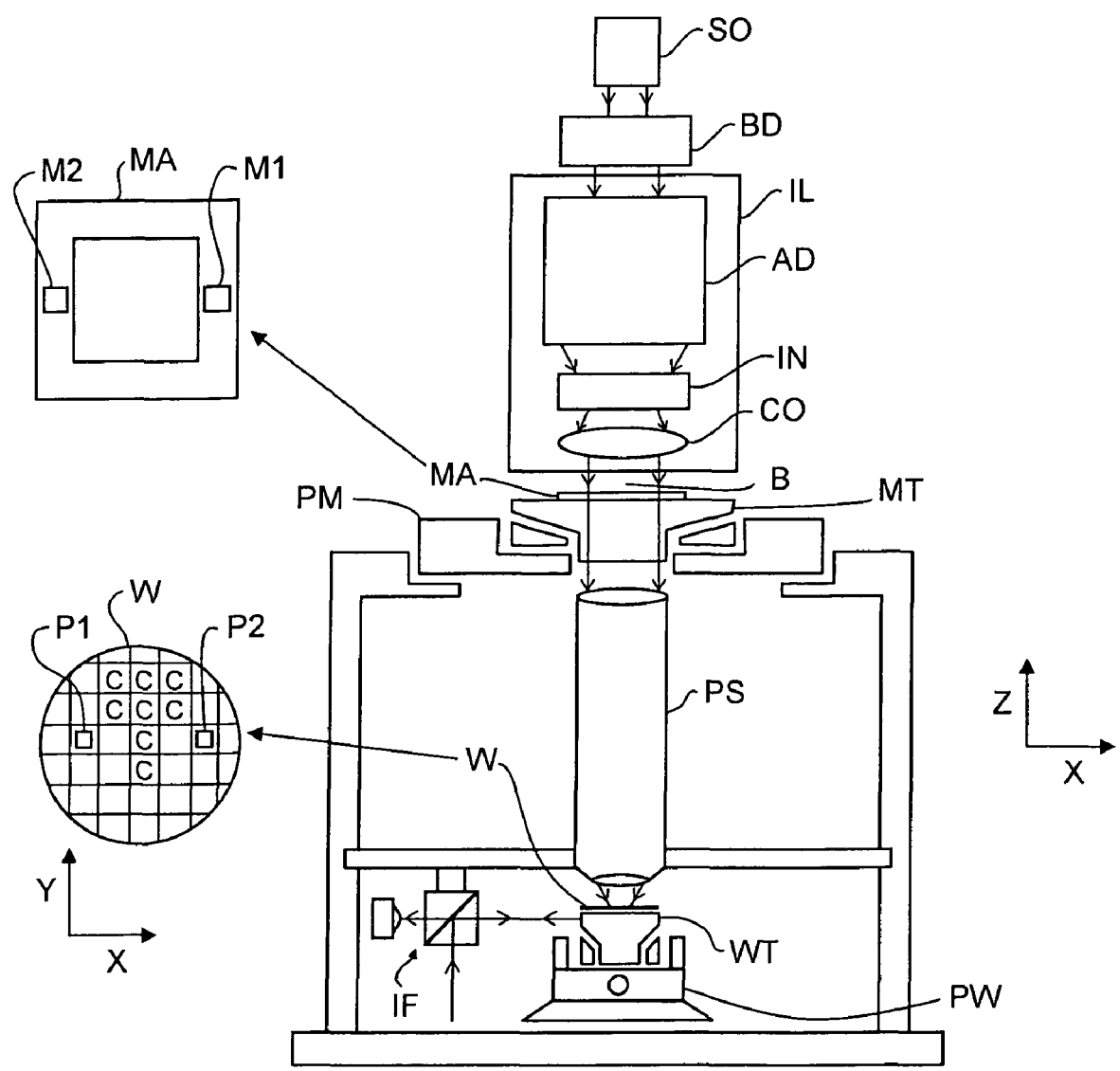
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
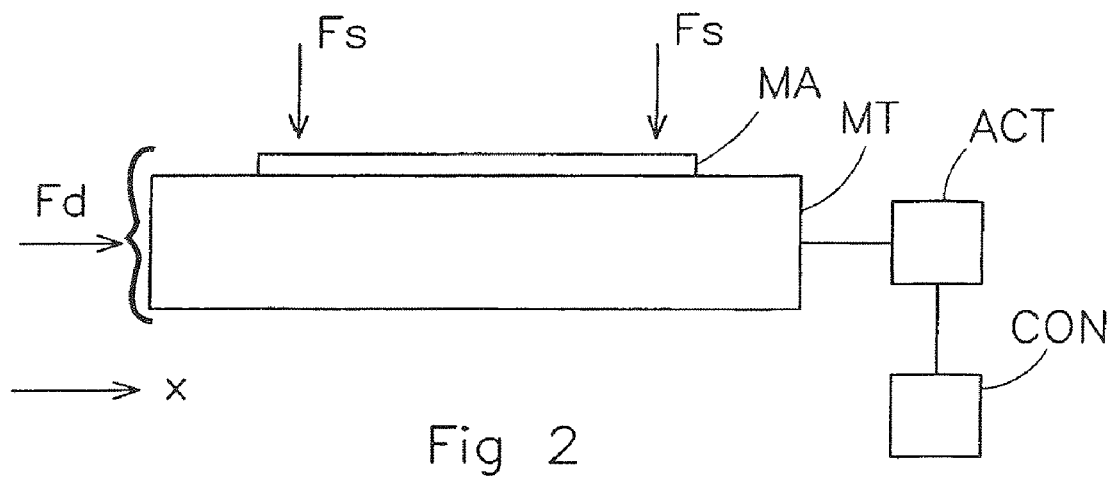
FIG. 2 depicts a side view of a patterning device and support according to an embodiment of the invention.

FIG. 2 shows a support, such as in this example mask table MT which holds a patterning device or mask MA. As explained above with reference to FIG. 1, the support may be moved with respect to a stationary part of the lithographic apparatus, thereby moving the patterning device MA held by it, to perform a scanning or stepping operation, to irradiate different parts of the substrate, or for other reasons, such as to bring the patterning device in a range of operations of a handler which may take the patterning device from the support to exchange it for another patterning device. One of more motors or other actuators may have been provided to move the support MT.

As explained above, slippage between the patterning device MA and the support MT may occur when accelerating the support MT. To hold the patterning device MA to the support, a force is applied, in this example the stationary force Fs to hold the patterning device against the support MT. The force Fs may be created in a variety of ways, for example using vacuum suction, a clamping mechanism or any suitable holding mechanism. The stationary force Fs may for example include a normal force. As the force Fs presses the patterning device against the support, or pulls the patterning device against the support, a holding of the patterning device by the support in case of an acceleration of the support in the direction indicated by X, will rely on a friction between the patterning device and the support, more precisely on the friction between the surfaces of the patterning device and the support which contact each other.

The inventors have now devised that initially, when Fs is applied, a friction to be obtained between the patterning device and the support may not be optimum. This is, because a surface structure of the support and a surface structure of the patterning device, when held against each other, may not perfectly match each other due to imperfections in flatnesses of each of these surfaces. Further, gravity may lead to a deformation of one or both of the patterning device and the support. Also, deformation may be caused by other forces acting on the patterning device, e.g. by a reticle/patterning device gripper.

As a result, some phenomena may be observed: firstly, mechanical tension may be created in the patterning device and/or the support as a result of the imperfections in flatness of the surfaces being held against each other by the force Fs. Such tensions locally result in a change in the local force with which the patterning device and the substrate are locally pressed together, at some places increasing this force, at other places reducing it. A local friction to be obtained between the patterning device and the support is however dependent on the force with which these items are held together locally. Thus, the friction may be locally increased or decreased due to the tensions occurring because of, for example, imperfections in the flatnesses of the surfaces held together.

Due to this local difference in the amount of friction available, local slippage may occur. In other words, at some areas of the surface of the patterning device where it is held against the support, some amount of slippage may occur which may result in a deformation, distortion or other phenomena in the patterning device. In this document, this phenomenon of local slipping, i.e. a slipping of parts of the patterning device with respect to the support, is referred to as micro slipping of the patterning device with respect to the support. It will be appreciated that the micro slipping may not result in large displacements, as the patterning device as a whole is still held by the support. Due to the local displacements caused by micro slipping, deformation of the patterning device may occur, which may adversely affect an accuracy of the transferring of the pattern from the patterning device onto the substrate. It is noted that the micro-slipping may however does not necessarily need to result in minimal local displacements. The patterning device as a whole may keep a same position with respect to the support, the micro-slipping however taking away local tensions in the patterning device, thereby overall improving the friction between the patterning device and the support, thus improving a holding of the patterning device by the support as well as reducing possible settlements due to micro-slippage during a use of the patterning device to transfer the pattern onto the substrate.

The inventors have devised that the phenomenon of micro slipping may be reduced after subjecting the patterning device to an acceleration. The inventors have realized that a possible explanation therefor may be found in the fact that the subjecting of the patterning device to acceleration at a level which is high enough to enable some degree of micro slipping (however which is sufficiently low to prevent a slipping of the patterning device as a whole), will enable the patterning device to "settle" with respect to the support, thereby creating a reduction of tension in the patterning device, and consequently more evenly distributing over the contacting surface between the patterning device and the support the pressure with which these parts are held together. As a consequence, the friction between the patterning device and the support will be more evenly distributed over the surface of the contact area, as a result thereof reducing a risk of micro slipping.

According to an embodiment of the invention, the patterning device may now be excited by a substantially dynamic force to enable a micro slipping of the patterning device, after the patterning device and the support have been brought together and after the substantially stationary force Fs has been applied between the patterning device and the support. Due to the dynamic force, indicated as an example by Fd in FIG. 2, the patterning device may "settle" with respect to the support resulting in a reduction in local tensions in the patterning device due to imperfections in a surface of the patterning device, respectively, the support at the contacting area therebetween, therefore resulting in a more evenly distributed friction among the surface of the contact area of the patterning device. Thereafter, alignment may be performed, the term alignment should here be interpreted as any procedure to position the patterning device and the substrate onto which the pattern is to be transferred, with respect to each other. This may be by a displacement of one or both of the patterning device and the substrate with respect to each other, e.g. by displacing the substrate table and/or the support, or in any other optical way, e.g. by any suitable operation in the projection system to have the pattern projected onto an appropriate part of the surface of the substrate. In the context of this document, the term stationary force may be understood as a force which is substantially stationary during e.g. a transferring of the pattern from the patterning device onto the substrate.

Commonly, the stationary force will have a substantially same value from the moment in time at which the patterning device is held to the support by e.g. the clamping mechanism, vacuum suction mechanism, etc, until the moment in time at which the patterning device is released, e.g. to be able to remove it from the support. In the context of this document, the term dynamic force may be understood as a force which on the one hand has a short duration, in other words a force which is applied after the patterning device and the support have been brought together and after the substantially stationary force has been applied thereto, while the dynamic force may be halted before the aligning of the patterning device and the transferring of the pattern onto the substrate. The dynamic force may thus be understood as a force which is applied to the patterning device between the mounting of the patterning device to the support and the usage of the patterning device to transfer the pattern onto the substrate. The dynamic force may have any profile, for example it may have a form of an impulse, a shock wave, it may periodically change over time (e.g. an alternating signal), etc. Examples which are particularly beneficial will be described below. The dynamic force may be applied to the patterning device directly, however it is equally well possible that the dynamic force is applied to the support. Applying the dynamic force to the support may provide the benefit that it reduces a risk of damaging the patterning device, which could occur when the dynamic force would be applied by any kind of mechanism to the patterning device directly. This is because applying the force to the support will result in a distribution of the force via the support, hence providing a relatively evenly distributed force onto the patterning device. If the force would be provided to the patterning device directly by e.g. a pushing mechanism, excitation mechanism, or similar, then some risk of damaging the patterning device may come forward, especially in case of high values of the force, which risk of damage is to be avoided because damage to the patterning device would necessitate an operator of the lithographic apparatus to stop a production line or foundry facility of which the lithographic apparatus may form part.

The dynamic force may be generated by a separate actuator, such as actuator ACT in FIG. 2. However, it is also possible that use is made of one or more of the existing actuators to move the support, including for example one or more linear motors. The actuator or motor may be driven by a control device, including e.g. a microprocessor, microcontroller, microcomputer or other programmable device. The controller may be a separate controller, however it may equally well be the case that the controller is included in an existing controller, which e.g. functions in a multi tasking environment, a task of which being the controlling of the actuator ACT or other motor as described here.

In a further embodiment, a further effect by the excitation of the patterning device by the dynamic force, is that some sliding or slippage of the patterning device with respect to the support will decrease a contaminant area, thereby increasing an effective contact between the patterning device and the support. Thus, according to an embodiment of the invention, a dynamic force at a somewhat higher level may be applied to the patterning device which not only results in micro slipping as described above, but which may also lead to some degree of sliding to obtain the decreasing of contamination described here. The inventors have found that thereby not only contamination will be decreased, but also the micro slip as described above will be reduced in a manner similar to the above description.

Figure 3A:
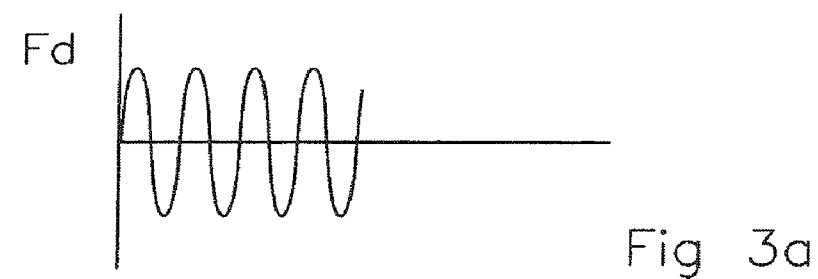
FIG. 3a-3e depicts time diagrams of excitations of the patterning device according to aspects of the invention.
Figure 3B:
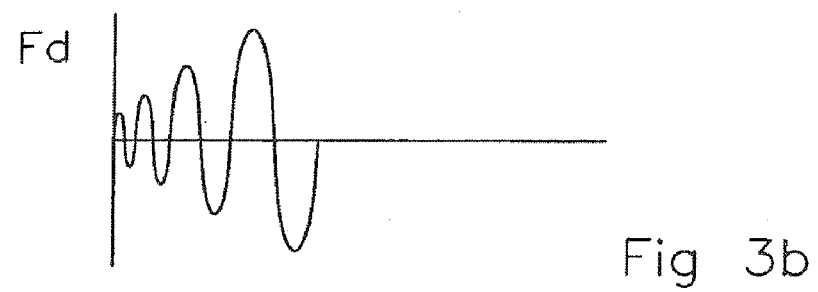

FIGS. 3a-3e show time diagrams, showing examples of the dynamic force Fd. In FIG. 3a, a dynamic force is shown which is alternating, in this example having a sinusoidal pattern over time, however any other alternating pattern may be applied. The alternating force will result in an alternating acceleration of the support, and consequently an alternating acceleration of the patterning device. Thereby, a high excitation, thus a high force may be obtained with a low range of movement of the patterning device. Furthermore, a risk of losing the patterning device due to a loosening from the support may be prevented, as the alternating force alternately changes direction. Therefore, a damage of the patterning device due to an accidentally falling off of the support by the application of the dynamic force, may be significantly reduced. To further reduce a risk of loosening of the patterning device, a level of the acceleration may be increased during the accelerating of the stage, an example of which is depicted in FIG. 3b. In FIG. 3b, a sinusoidal shape over time of the dynamic force is shown, a level thereof increasing over time, however instead of or in addition to the sinusoidal shape, any other e.g. alternating profile may be applied. The inventors have devised that approximately 50 movement cycles of the support may be adequate to sufficiently reduce tension in the patterning device, thereby providing a preferred range of approximately 45 to 55 movement cycles of the support. In case of less demanding applications, or in case of a highly flat patterning device, respectively, support, less cycles may be sufficient, e.g. at least about 25 cycles. In the examples shown in FIGS. 3a and 3b, examples of an alternating acceleration have been shown, effectively providing a vibration to the patterning device. The alternating acceleration may however not only be formed by a vibration, however instead or in addition thereto, the alternating acceleration may also include a performing of scanning movements, stepping movements or other movement cycles which the patterning device is subjected to during normal operation of the lithographic apparatus. This has the benefit of applying forces to the patterning device which are similar to or identical to those under normal operating conditions, thus providing for a good settling of the patterning device and the support with respect to each other, however at the expense of an increased time, as an excitation of for example approximately 45 to 55 scanning of stepping cycles of the stage will cause considerably more time than an excitation of for example 45 to 55 cycles of a vibration.

Figure 3C:
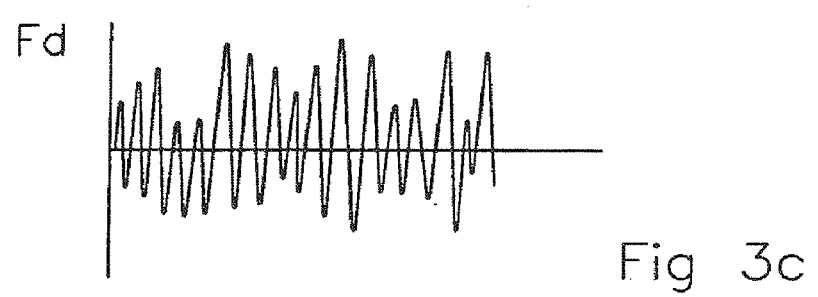

A further example is shown in FIG. 3c, where an example of the dynamic force is shown which includes a noise burst, e.g. in a predetermined frequency band. A benefit of applying noise (e.g. pink noise) especially comes forward in case of an excitation at a resonance frequency (which will be described below). By applying noise, excitation in a frequency band may be performed, which will result in an excitation at resonance frequencies within that range. Thereby, the excitation in made less sensitive to variations of such resonance frequencies, because, as long as the resonance frequency is within the frequency band of the noise, excitation at that frequency will take place.

Figure 3D:
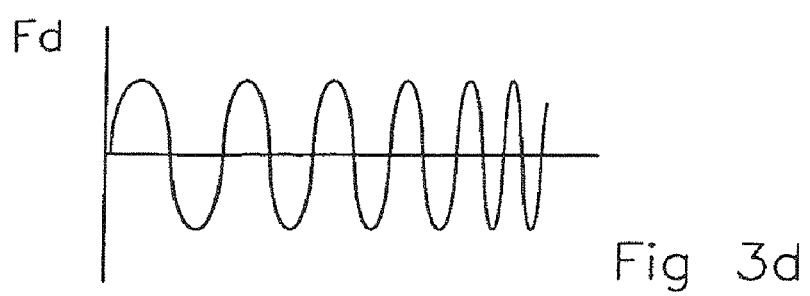

A further embodiment is shown in FIG. 3d, where an alternating force is applied to the patterning device which alternating force comprises a frequency sweep. A similar benefit as described above with reference to the noise burst, may also be applicable to the frequency sweep.

Figure 3E:
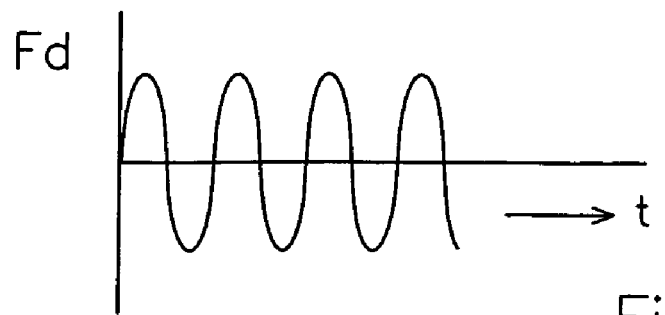

Instead of or in addition to the multiple frequency period signals as depicted in e.g. FIGS. 3c and 3d, it is also possible to apply a single frequency periodic signal to the patterning device, as depicted in FIG. 3e.

Further to the examples of embodiments of dynamic forces shown in FIGS. 3a-3e, it is also possible that a sawtooth pattern is applied, thereby creating a fast movement in one direction and a slow movement in the other, opposite direction. Thereby, an occurrence of slippage may be detected by measuring by any suitable measurement positioning system if a displacement of the patterning device with respect to the support has occurred. In the exemplary embodiments described above, the dynamic force may include any frequency or frequency band. A maximum frequency will be determined by the force required to accelerate, as the higher the frequency, the higher the forces required to reach the corresponding accelerations. Therefore, in current implementations, a maximum frequency may be for example approximately 150 Hz.

In a further embodiment, the excitation may be performed at a resonance frequency of the patterning device, the support, or both the patterning device and the support. Thereby, large accelerations may be achieved with a relatively small dynamic force. Thus, relatively little forces are needed to be able to obtain a sufficiently high acceleration of the patterning device to enable the settling effects as described above. The excitation at a resonance frequency may be performed in a plurality of ways, e.g. by applying a noise burst in a predetermined frequency band (the frequency band including the resonance frequency), applying a frequency sweeping periodic signal (the frequency sweep including the resonance frequency), or applying a single frequency periodic signal having the resonance frequency, as have been described above. Further embodiments as described above may also be applied to the case where the excitation is performed at the resonance frequency, providing same of similar advantages.

A variety of useful resonance modes will be explained now with reference to FIGS. 4a-4f. Here, FIGS. 4a-4c show patterning device resonance modes, also indicated as reticle resonance modes, while FIGS. 4d-4f show support resonance modes, indicated here as chuck resonance modes. It is remarked that FIGS. 4a-f also shows an indication of the X, Y and Z axis as will be referred to here. A plane of the patterning device is assumed to be substantially parallel to a plane defined by the X and Y axis.

FIGS. 4a-4c respectively show a patterning device torsion mode, also indicated as Rx decoupling mode, a reticle umbrella mode, also indicated as a Z-decoupling mode, and a reticle Y-decoupling mode. In a current implementation, frequencies of these resonances may be found, for example, between 500-600 Hz, 700-900 Hz, and above 2000 Hz respectively. Similarly, FIGS. 4d-4f respectively show a support torsion mode, indicated here as a chuck torsion mode, a support Rx bending mode, and a support Y-stretch mode. In a current implementation, frequencies of these resonances may for example be found between 300-600 Hz, 400-800 Hz, and 1000-2500 Hz respectively. These resonance modes cause a relatively large deformation between patterning device and support, thereby enabling to make use of relatively limited excitations to invoke the resonance. The deformation may thus be obtained by resonating the patterning device and/or the support, as both result in a friction between the patterning device and the support, thereby enabling an occurrence of microslip of the patterning device with respect to the support. Depending on resonance characteristics of the patterning device and/or the support, a suitable resonance mode for a particular application may be chosen.

Figure 5:
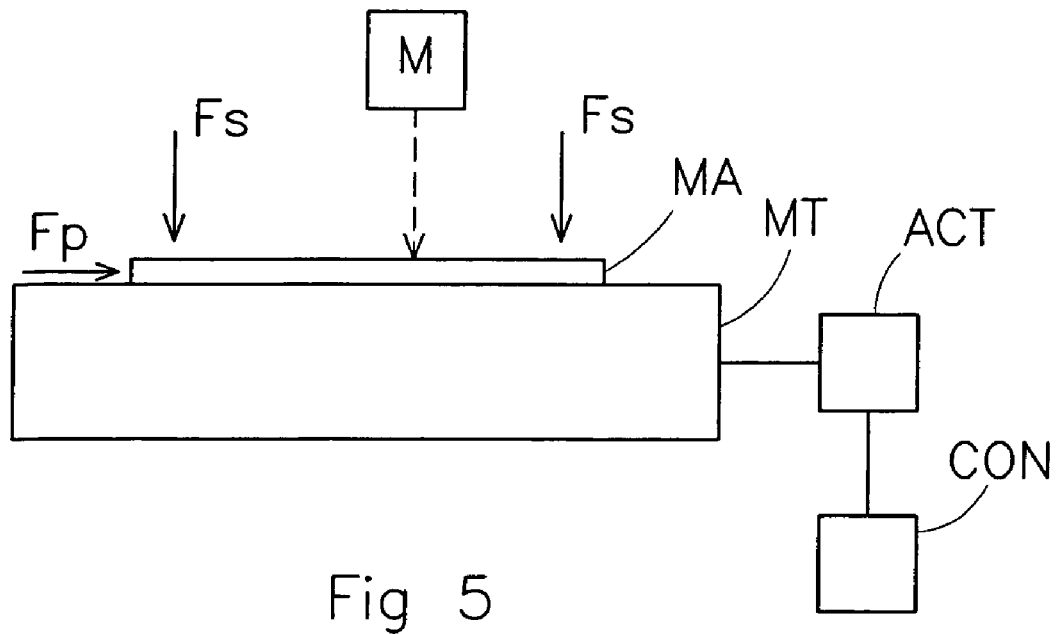
FIG. 5 depicts a part of a lithographic apparatus according to an embodiment of the invention.

A further embodiment of the invention will now be explained with reference to FIG. 5. FIG. 5, similar to FIG. 2, shows a patterning device MA held by a support MT. A substantially stationary force Fs is applied to hold the patterning device to the support. Also, similar to FIG. 5, an actuator ACT is shown to excite the support MT, the actuator being controlled by controller CON. According to this embodiment of the invention, a holding of the patterning device by the support may be tested. Thereby, a sufficiency of friction between the patterning device and the support may be tested. This testing may be performed by measuring a position of the patterning device with respect to the support, by e.g. measurement system M. This measurement system M may include any suitable position measurement system, such as an optical measurement system, examples of which will be known to the person skilled in the art. After a position of the patterning device with respect to the support has been measured, a substantially planar force is applied to the patterning device, as indicated in FIG. 5 by Fp. The planar force is gradually increased while the position of the patterning device is measured again, for example repeatedly. The planar force is now gradually increased until a displacement of the patterning device with respect to the support is measured. A magnitude of the force Fp at which the displacement takes place, provides a measure for the holding of the patterning device by the support. If the displacement of the patterning device only takes place at a high value of the planar force Fp, the planar force having a value which would not be reached under normal operating conditions when moving the support, then a holding of the patterning device by the support may be considered sufficiently good. On the other hand, if a displacement of the patterning device already appears to occur at a value of the planar force Fp which is within a range to be reached during normal operating conditions of the support and patterning device, then insufficient holding is obtained. In that case, excitation as described above may be performed to have the patterning device settled with respect to the support. Further, a cleaning of the patterning device, support or both may be required to remove any residuals or contamination which may have attached thereto and which may result in a reduction of the friction between the patterning device and the support.

The planar force Fp may be applied by any suitable actuator, it is for example possible that a pushing mechanism is provided to push against a side of the patterning device MA. However, it may equally well be possible that the actuator ACT is used to move the support MT, thereby generating a planar force Fp onto the patterning device by its inertia. In general, use may be made of an existing actuator, such as a linear motor to position the support: by actuating this motor, the support may be moved, thereby creating by inertia and by the friction between the patterning device and the support, a force on the patterning device to excite the patterning device. Alternatively, it is possible that any other actuator is applied which acts directly or indirectly on at least one of the patterning device and the support. As an example, the actuator may be positioned on the support, an excitation of the actuator to make the support and/or patterning device vibrate. In another example, the actuator may be positioned on a part of a linear motor (or motor combination such as a combination of a long stroke and short stroke motor) to drive the support, a vibration of the actuator to make the support and/or patterning device vibrate. Further, the actuator may be positioned at any other position where an excitation of the actuator may result in an excitation of one or both of the patterning device and the support (as an example, the actuator may include a loudspeaker, an excitation of the loudspeaker via a gas in the lithographic apparatus transferring a force onto the patterning device and/or the support).

Furthermore, in the context of this document, the expression exciting the patterning device by a dynamic force or similar wording should be understood as to include any type of excitation: The dynamic force may act mediately or immediately on the patterning device. As described above, the patterning device may be excited directly (e.g. by an actuator acting on the patterning device) or indirectly, in that e.g. the support in excited by an actuator acting directly on indirectly on the support. Any of these or other configurations should be understood as to be included in the wording exciting the patterning device, because in any of these configurations, a form of excitation of the patterning device (e.g. with respect to the support) is obtained.

Figure 6:
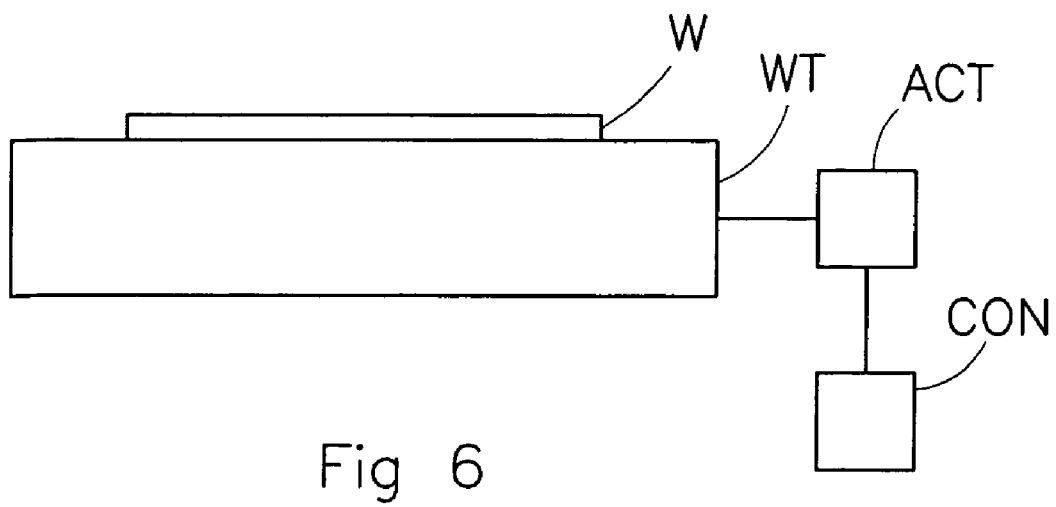
FIG. 6 depicts a part of a lithographic apparatus according to an embodiment of the invention.

The various embodiments of the invention may not only be applied to a holding of the patterning device to the support, however may in addition thereto or instead thereto also be applied to a holding of the substrate W by the substrate table WT. Thus, where in the above the holding of the patterning device by the support has been described, this may equally well be read as a holding of the substrate W by the substrate table WT. Thereby, similar benefits may be achieved, such as reducing a slipping or micro slipping of the substrate W with respect to the substrate table WT, when accelerating the substrate table WT. Thus, the above explanation and embodiments as described with reference to FIGS. 2-5 may also be applied to the substrate held by the substrate table as depicted in FIG. 6.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device manufacturing method, comprising:
    applying a substantially stationary force to maintain a patterning device on a support;
    exciting the patterning device by a substantially dynamic force to enable a micro-slipping of the patterning device;
    aligning the patterning device; and
    transferring a pattern of the patterning device onto a substrate.

2. The method according to claim 1, wherein the exciting comprises accelerating the patterning device with an alternating acceleration.

3. The method according to claim 2, wherein a level of the acceleration is increased during the accelerating of the patterning device.

4. The method according to claim 2, wherein the exciting comprises performing at least about 25 movement cycles of the patterning device.

5. The method according to claim 2, wherein the exciting comprises vibrating the patterning device.

6. The method according to claim 5, wherein the exciting comprises applying a noise burst in a frequency band to the patterning device.

7. The method according to claim 5, wherein the exciting comprises applying a frequency sweeping periodic signal to the patterning device.

8. The method according to claim 5, wherein the exciting comprises applying a single frequency periodic signal to the patterning device.

9. The method according to claim 1, wherein the exciting is performed at a resonance frequency of the patterning device, the support or both.

10. The method according to claim 9, wherein the exciting comprises applying a noise burst in a frequency band to the patterning device.

11. The method according to claim 9, wherein the exciting comprises applying a frequency sweeping periodic signal to the patterning device.

12. The method according to claim 9, wherein the exciting comprises applying a single frequency periodic signal to the patterning device.

13. The method according to claim 9, wherein the resonance frequency comprises a patterning device torsion resonance mode.

14. The method according to claim 9, wherein the resonance frequency comprises a patterning device umbrella resonance mode.

15. The method according to claim 9, wherein the resonance frequency comprises a patterning device decoupling mode.

16. The method according to claim 9, wherein the resonance frequency comprises a support torsion resonance mode.

17. The method according to claim 9, wherein the resonance frequency comprises a support umbrella resonance mode.

18. The method according to claim 9, wherein the resonance frequency comprises a support decoupling mode.

19. A method of holding a patterning device on a support constructed to hold the patterning device, the method comprising:
    applying a substantially stationary force to maintain a patterning device on a support; and
    exciting the patterning device by a substantially dynamic force to enable a micro-slipping of the patterning device.

20. A lithographic apparatus comprising:
    a support constructed to hold a patterning device;
    an actuator configured to excite the patterning device; and
    a control unit configured to control the actuator,
    wherein the control unit is arranged to drive the actuator to excite the patterning device by a substantially dynamic force to enable a micro-slipping of the patterning device, prior to aligning the patterning device.

21. The lithographic apparatus according to claim 20, wherein the control unit is arranged to cause acceleration of the patterning device with an alternating acceleration.

22. The lithographic apparatus according to claim 21, wherein a level of the acceleration is increased during the acceleration of the patterning device.

23. The lithographic apparatus according to claim 21, wherein the control unit is arranged to drive the actuator to perform at least about 25 movement cycles of the patterning device.

24. The lithographic apparatus according to claim 21, wherein the control unit is arranged to cause vibration of the patterning device.

25. The lithographic apparatus according to claim 24, wherein the control unit is arranged to cause application of a noise burst in a frequency band to the patterning device.

26. The lithographic apparatus according to claim 24, wherein the control unit is arranged to cause application of a frequency sweeping periodic signal to the patterning device.

27. The lithographic apparatus according to claim 24, wherein the control unit is arranged to cause application of a single frequency periodic signal to the patterning device.

28. The lithographic apparatus according to claim 20, wherein the control unit is arranged to drive the actuator to excite the patterning device at a resonance frequency of the patterning device, the support or both.

29. The lithographic apparatus according to claim 28, wherein the control unit is arranged to cause application of a noise burst in a frequency band to the patterning device.

30. The lithographic apparatus according to claim 28, wherein the control unit is arranged to cause application of a frequency sweeping periodic signal to the patterning device.

31. The lithographic apparatus according to claim 28, wherein the control unit is arranged to cause application of a single frequency periodic signal to the patterning device.

32. The lithographic apparatus according to claim 28, wherein the resonance frequency comprises a patterning device torsion resonance mode.

33. The lithographic apparatus according to claim 28, wherein the resonance frequency comprises a patterning device umbrella resonance mode.

34. The lithographic apparatus according to claim 28, wherein the resonance frequency comprises a patterning device decoupling mode.

35. The lithographic apparatus according to claim 28, wherein the resonance frequency comprises a support torsion resonance mode.

36. The lithographic apparatus according to claim 28, wherein the resonance frequency comprises a support umbrella resonance mode.

37. The lithographic apparatus according to claim 28, wherein the resonance frequency comprises a support decoupling mode.

38. A support constructed to hold a patterning device, the support comprising:
   an actuator to excite the patterning device, and
   a control unit to control the actuator,
   wherein the control unit is arranged to drive the actuator to excite the patterning device by a substantially dynamic force to enable a micro-slipping of the patterning device, prior to aligning the patterning device.

39. A device manufacturing method, comprising:
   applying a substantially stationary force to hold a patterning device on a support;
   testing the holding of the patterning device on the support;
   aligning the patterning device; and
   transferring a pattern of the patterning device onto the substrate,
   wherein the testing comprises:
      measuring a position of the patterning device with respect to the support;
      applying to the patterning device a substantially planar force; and
      gradually increasing the planar force until a displacement of the patterning device with respect to the support is measured.

* * * * *